United States Patent
Dollar, II

(10) Patent No.: US 6,633,824 B2
(45) Date of Patent: Oct. 14, 2003

(54) DIRECT CURRENT ELECTRICAL SYSTEM ARC DETECTION APPARATUS AND METHOD

(75) Inventor: Charles Randall Dollar, II, Norcross, GA (US)

(73) Assignee: Siemens Energy & Automation, Inc., Alpharetta, GA (US)

(*) Notice: Subject to any disclaimer, the term of this patent is extended or adjusted under 35 U.S.C. 154(b) by 230 days.

(21) Appl. No.: 09/821,449

(22) Filed: Mar. 29, 2001

(65) Prior Publication Data

US 2002/0183944 A1 Dec. 5, 2002

(51) Int. Cl.⁷ .............................................. G01R 31/00
(52) U.S. Cl. ........................................................ 702/58
(58) Field of Search ............................... 702/57, 58–60, 702/62, 75, 79, 106, 185, 191, 193, FOR 105, FOR 106, FOR 107, FOR 111, FOR 134, FOR 156, FOR 166, FOR 171; 361/2, 105, 42, 64, 72, 679; 324/117 R, 509, 536; 355/16–18, 35

(56) References Cited

U.S. PATENT DOCUMENTS

| | | | |
|---|---|---|---|
| 5,223,795 A | | 6/1993 | Blades ........................ 324/536 |
| 5,272,439 A | * | 12/1993 | Mashikian et al. .......... 324/520 |
| 5,432,455 A | | 7/1995 | Blades ........................ 324/536 |
| 5,434,509 A | | 7/1995 | Blades ........................ 324/536 |
| 5,706,159 A | | 1/1998 | Dollar et al. ................ 361/113 |
| 5,729,145 A | * | 3/1998 | Blades ........................ 324/536 |
| 6,031,699 A | | 2/2000 | Dollar et al. ................... 361/42 |
| 6,407,893 B1 | * | 6/2002 | Neiger et al. .................. 361/42 |
| 6,421,214 B1 | * | 7/2002 | Packard et al. ................. 361/7 |

OTHER PUBLICATIONS

Page 5 (in two sheets) of "Year in Review" portion of the internet version of the Eaton Annual Report 2000.

* cited by examiner

Primary Examiner—Marc S. Hoff
Assistant Examiner—Mohamed Charioui

(57) ABSTRACT

Disclosed is an arc detection circuit for monitoring an electrical distribution system which results in detecting arcing in the electrical distribution system and the ability to provide notification and protection for such arcing. The system functions to monitor the electrical distribution system to sense the frequencies of signals in the system using appropriate filtering. One type of filtering which may be used is based upon a heterodyning circuit which provides variable frequency filtering for filtering a signal representative of the current in at least one electrical circuit of the electrical system. The heterodyning circuit output is configured to produce a signal which may be logarithmically related to the filtered signal. If the output signal exceeds a predetermined limit (representative of noise) for a predetermined period (representative of a typical arc duration), the system generates an arc signal. The arc signal may then be used to operate a circuit interrupter or an indicator in a circuit protection system.

20 Claims, 4 Drawing Sheets

DIRECT CURRENT ELECTRICAL SYSTEM ARC DETECTION APPARATUS AND METHOD

FIELD OF THE INVENTION

The present invention relates, in general, to arc fault detection and, more specifically, to arc fault detection in a direct current electrical system.

BACKGROUND OF THE INVENTION

There are various conditions that may cause an arc fault. Corroded, worn or aged wiring or insulation, insufficient contact pressure, electrical stress from repeated overloading, etc., may result in an arc fault. These conditions may damage the insulation of the wiring and create excessive heating temperatures. In general, these conditions have been found to occur in applications where vibrations and relatively high temperatures are normally present. More specifically, vehicles (e.g. automobiles, airplanes, trucks, off-road equipment, etc.) and other moving or vibrating equipment provide a harsh environment for electronics and electrical systems (direct current (D.C.) or alternating current (A.C.)).

The development of electronics and electrically powered accessories has resulted in an increase in the use of electronics and electrical power in vehicles. Examples of electronics and electrically powered accessories used in vehicles include:

- electronic fuel injection or fuel control;
- electronic timing control;
- electronic transmission shift control;
- electronic HVAC control;
- electronic lighting control;
- electronic braking control (e.g. anti-lock braking, traction control, slip control, etc.);
- power convenience accessories (e.g. power seats power windows, heated seats, personal lighting, heated steering wheels, power sun roof, power steering wheel tilt, power mirrors, tire inflation control, etc.);
- electronic cruise control;
- on-board navigation systems; and
- air bags.

Many of the electronics and power accessories listed above are also used in aircraft and off-road vehicles (e.g. tractors, tracked vehicles, excavators, etc.). With hybrid and pure electric vehicles, the use and transmission of electrical power is multiples greater than with conventional vehicles due to the use of electricity to power the motors which propel the vehicles.

As a result of the substantial increase in use of electronics and electrical power accessories in vehicles, and the use of electric motors to propel vehicles, the potential for arc faults in the electrical systems of vehicles has also increased. As discussed above, such arcing can damage wiring and electronics or, cause unwanted heating. Thus, it would be desirable to provide a system for detecting and controlling arc faults in vehicle electrical systems.

Detection and control of arc faults is relatively complicated. For example, the occurrence of an arc fault in one branch circuit of a power distribution system of a vehicle may generate a false arc detection signal in another branch circuit. As a result, circuit breakers or interrupters in more than one branch circuit may erroneously trip. Relatively noisy loads within the vehicle, such as electric motors (engine fan, heater fan, power seat motors, etc.) can create high frequency disturbances, which may appear to be arc faults and cause unwanted circuit breaker tripping. Similarly, external high frequency disturbances within the vehicle's operative environment also may appear to be arc faults and cause unwanted circuit tripping.

There are two types of arc faults that may occur in a vehicle. A first type is a high-energy arc that may be related to high current faults; a second type is a low current arc that may be related to the formation of a carbonized path between conductors. The first type may result from an inadvertent connection between a line conductor and neutral conductor or a line conductor and ground. The first type may draw current that is above the rated capacity of the circuit, arcing as the conductors are physically joined.

The other type of arc fault, the carbonization between electrical conductors, may be considered more problematic. Since the current in the arc may be limited to less than the trip rating of an associated circuit breaker or interrupter, such arcs may become persistent without observation and may result in certain conditions. Contact arcs may be caused by springs in switches that become worn which, in turn, may reduce the forces that hold electrical contacts together. As the electrical contacts heat and cool down, the conductors may touch and separate repeatedly, thereby possibly creating arcs known as "sputtering arcs." Such sputtering arcs can create carbonized paths resulting in persistent low current arcs in the electrical system.

Contact arcs or sputtering arcs may also be observed in contacts which are made from different materials. For example, aluminum wiring which contacts copper wiring may oxidize at the contact points. In this case a non-conductive layer may build up over time between the contact points and arcing may result.

In view of the potential for arc faults in vehicles, it would be desirable to provide vehicles with arc fault detection.

SUMMARY OF THE INVENTION

One embodiment of the present invention provides an arc detection circuit for detecting an arcing fault in a DC electrical system having a circuit protection system. The arc detection circuit comprises a superheterodyne circuit configured to monitor the DC electrical system. An oscillator circuit configured to generate an oscillator frequency with cycles between a low frequency and a high frequency is coupled to the superheterodyne circuit. A comparator circuit configured to eliminate background and spurious noise is coupled to the superheterodyne circuit and a reference voltage terminal. An arc timing monitor circuit configured to monitor time of the arcing fault based on a signal received from the comparator circuit. A compensating circuit configured to compensate for arcing drop outs when signal from the arc timing monitor circuit is received by the compensating circuit. An accumulating circuit configured to receive the signal from the compensating circuit and generate a further signal indicative of the arc fault if a predetermined time period is exceeded. And, a trip signal generation circuit configured to receive the further signal from the accumulating circuit and generate an arc signal to operate the circuit protection system. Another embodiment of the arc detection circuit includes filters coupled to the superheterodyne circuit. A further embodiment of the arc detection circuit provides each filter is configured to operate at a frequency of 10.7 mega Hz.

Another embodiment of the present invention provides a method for detecting an arcing fault in a DC electrical system having a circuit protection system. The method of arc detection comprises the steps of monitoring the DC electrical system with a superheterodyne circuit. Generating an oscillator frequency which cycles between a low frequency and a high frequency, with an oscillator circuit coupled to the superheterodyne circuit. Eliminating background and spurious noise with a comparator circuit coupled to the superheterodyne circuit and a reference voltage terminal. Monitoring time of the arcing fault based on a signal from the comparator circuit with an arc timing monitor circuit. Compensating for arcing drop-outs based on a signal from the arc timing monitor circuit with a compensating circuit. Generating a further signal indicative of the arc fault if a predetermined time period is exceeded, with an accumulating circuit based on the signal from the compensating circuit. And, generating an arc signal to operate the circuit protection system with a trip signal generation circuit based on the further signal from the accumulating circuit.

Another embodiment of the present invention provides an arc detection circuit for detecting an arcing fault in a DC electrical system having a circuit protection system. The arc detection system comprising a means for monitoring the DC electrical system. A means for generating an oscillator frequency which cycles between a low frequency and a high frequency with the means for generating coupled to the means for monitoring. A means for eliminating background and spurious noise coupled to the means for monitoring and a reference voltage terminal. The means for monitoring time of the arcing fault based on a signal from the means for eliminating. A means for compensating for arcing drop-outs based on a signal from the means for monitoring time. A means for generating a further signal indicative of the arc fault if a predetermined time period is exceeded, based on the signal from the means for compensating. And, a means for generating an arc signal to operate the circuit protection system, based on the further signal from the means for generating a further signal. An additional embodiment provides the means for monitoring to be coupled to the DC electrical system by one of an electromagnetically coupler or a mechanical coupler.

DETAILED DESCRIPTION OF THE PREFERRED EMBODIMENTS

Figure 1:
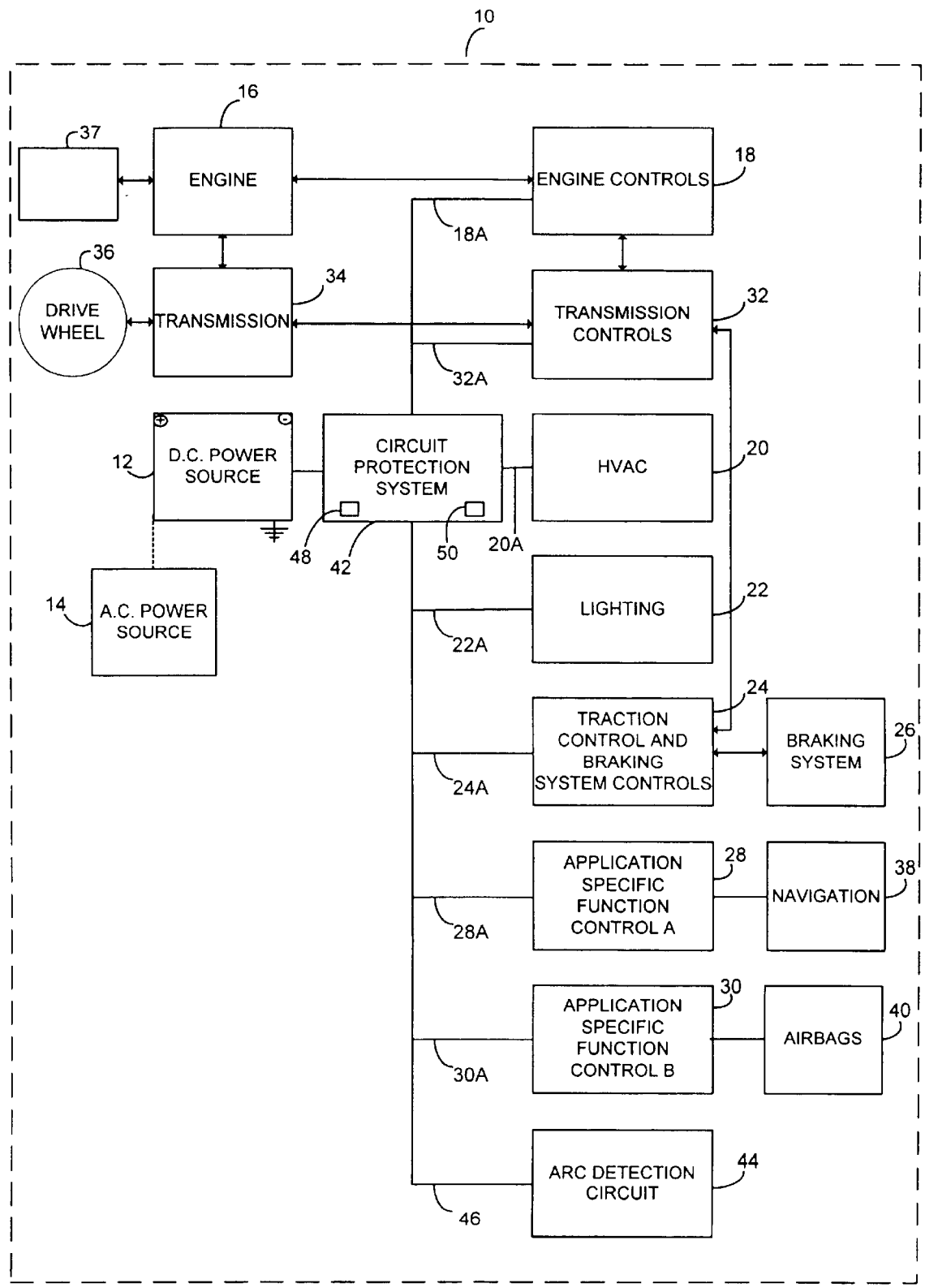
FIG. 1 is a block diagram representation of a vehicle including an embodiment of an arc detection circuit.

FIG. 1 is a block diagram representation of a vehicle 10 whether land, air or sea based. Vehicle 10 includes a D.C. energy storage power source 12 (e.g., a battery), an A.C. or D.C. power source 14 (e.g. a generator or alternator driven by engine 16, a fuel cell, or a photovoltaic device such as a solar cell array), a motor engine 16, engine controls 18, heating, ventilating and air conditioning system 20 (HVAC), lighting 22, traction and braking system controls 24, a braking system 26, an application function control A 28, and an application specific function control B 30. If the vehicle is a land based vehicle such as an automobile, truck or off-road equipment (e.g. tractor, excavator, tracked vehicle or construction equipment), the vehicle could also include electronic transmission controls 32, a transmission 34, and typically at least one driven wheel 36 and may include an implement 37. The implement 37 can be, for example, a spindle coupled to the motor 16 for spinning a material against a tool for shaping the material, or a movable arm coupled to the motor 16 to move materials in a predetermined manner such as a crane or a backhoe.

In general, in land based vehicle 10, motor engine 16 is mechanically coupled to transmission 34 which is mechanically coupled to at least one drive wheel 36. In operation the mechanical energy from engine 16 is transmitted through transmission 34 which controls the direction and speed of wheel 36 relative to engine speed 16. In most modern vehicles such as automobiles, engine 16 is controlled by electronic engine controls 18. Such controls 18 typically control electronic fuel injection, electronic timing and, in some cases, electronic engine valves. In most modern vehicles such as automobiles, high powered tractors and off-road equipment, electronic transmission controls 32 control the shifting of transmission 34 based upon parameters such as engine speed signals from electronic engine control 18, and signals from the electronic braking and traction control systems 24.

The HVAC system 20 typically includes temperature controls and air movement fans. Lighting system 22 typically includes the vehicle lighting and the appropriate lighting controls which vary substantially from vehicle to vehicle. More specifically, in addition to the primary vehicle lighting provided to permit vehicle operation in the dark, many vehicles include interior lighting systems for instruments and compartment lighting.

Referring to traction and braking system controls 24, these controls are coupled to the braking system 26 and, as discussed briefly above, to transmission control 32. Traction control systems are generally known and operate to pulse the brakes on various wheels of a vehicle to redirect power flow through the vehicle differentials to limit the application of power to a wheel spinning at a rate high relative to the other powered wheel(s) of the vehicle. The braking system control in most modern vehicles is commonly referred to as an antilock braking system and operates to relieve pressure on the brakes when the system determines that the wheel associated with a particular brake is sliding relative to the surface upon which the vehicle is traveling.

FIG. 1 includes two application function controls 28 and 30. However, depending upon on the vehicle, this number may vary. One example of an application specific function control would be the electronics and control system for an onboard navigation system 38. Another example of an application specific function control would be the control for the vehicle air bags 40. Other examples of systems which may require applications specific function controls include power seats, power windows, heated seats, personal lighting, heated steering wheels, power sun roofs, power steering wheel tilt, power mirrors, tire inflation control, off-road vehicle slip control, electronic cruise control, etc.

In vehicles including substantial numbers of the electronic controls and electrically powered accessories such as those discussed above, all of these controls require power from a power source such as D.C. power source 12 which in most vehicles is a storage battery which in turn today is charged by A.C. power source 14, that is typically an alternator and appropriate voltage regulator and rectification system. Alternatively, a D.C. generator can be used to charge the battery. As vehicle electronics and wiring systems become more complicated, a range of circuit protection 42 is provided. Many circuits in vehicles are currently protected by passive circuit protection such as fuses which are responsive to a very limited type of circuit fault. These limited types of circuit fault are short circuit and overload.

One of the problems with having a limited range of circuit protection is the absence of protection for circuits when arcing is occurring within the electrical system. Such arcing can create noise within the system which can interfere with sensitive electronics and, more dangerously, can create fire within the vehicle. Accordingly, circuit protection 42 includes a circuit interrupter 48, such as for example, controllable mechanical or semiconductor circuit interrupters and fuses for interrupting the application of D.C. power to the vehicle electronics. In particular, power source 12 is coupled to engine controls 18, transmission control 32, HVAC system 20, lighting 22, traction control and braking system controls 24, application specific function control A 28 and application specific function control B 30 with circuit protection system 42. In operation, circuit protection system 42 can interrupt power supplied to the various electronics via electrical distribution system 41 power conductors 18A, 32A, 20A, 22A, 24A, 28A and 30A.

In some applications, the circuit protection system 42 includes an indicator 49 that enunciates an arcing event in the one or more specific functions in the vehicle electronic system. Specific functions, such as electronic braking or window motors, should not have power cut-off, notwithstanding arcing. In such instances when the arc detection circuit 44 detects an arcing event, an arc signal is sent to the circuit protection system 42 which in turn activates the indicator 49. The indicator 49 can be a visual display that may comprise a warning light, an audible signal, including a message, tone or noise, or a tactile indicator such as a vibrating surface in contact with the system operator. The indicator 49 can be located within the vicinity of the operator of the vehicle 10 or machine having the arc detection circuit 44 to alert the operator to the arcing event with the operator then taking appropriate action. Thus, at the option of the arc detection system designer, the circuit protection system 42 can be configured to enunciate an arcing event, interrupt electrical power supply or both.

To protect against arcing within the vehicle electronic system an arc detection circuit 44 is provided. In particular, an arc detection circuit 44 is configured to detect signals generated within one or more conductors 18A, 32A, 20A, 22A, 24A, 28A or 30A which are representative of arcing within the electrical circuits, electronics and electrical equipment associated with these circuits. In simpler systems, arc detection circuit 44 may only monitor the power conductor from source 12. Of course, the specific monitoring scheme can be varied depending upon cost constraints, detection accuracy requirements, reliability requirements, etc.

In operation, arc detection circuit 44 monitors the conductors to determine if arcing is present. If an arcing event is present, circuit 44 provides an arc signal to the circuit protection system 42 along signal conductor 46 to activate an indicator 49 to notify the system operator, or the circuit interrupter 48 which then will trip one or more of the circuit breakers or circuit interrupters associated with the conductors to provide power from power source 12 to the respective controls and electrical equipment or both. Signal conductor 46 may include one or more signal conductors depending upon a number of conductors being monitored for arcing.

Depending upon the vehicle and electronics being provided power, circuit protection system 42 may include indicators 49 and circuit interrupters 48 such as electronically controlled circuit breakers or appropriate semiconductor switches which can be controlled (opened or closed) based upon a signal from arc detection circuit 44.

Vehicle 10 was described above as a land based vehicle. However, vehicle 10 could be any other type of vehicle including an airplane, jet, boat, etc. Depending upon the type of vehicle, the engine may be a piston engine or turbine engine and may be fueled by gasoline, diesel fuel, natural gas, etc. In the case of an airplane or jet, vehicle 10 would not include a transmission 34 or transmission controls 32. Rather, propulsion of the vehicle would be generated directly from turbine(s) or propeller(s) coupled to the engine (s) 16.

The use of vehicle electronics and electrically powered components has increased and continues to increase in vehicles. These increases in vehicle electronics has resulted in substantial rises in currents in conventional automotive powered systems which have typically a range of 12–14 volts. As a result, it is likely that battery voltages will be increased to voltages above 12 volts (e.g. range of 36 volts to 42 volts nominal). Currently, most over-the-road semi-trucks include 24 volt systems and aircraft include AC voltage systems for example nominal 24 volts AC. These increased voltages will also increase the potential for arcing due to the fact that increased voltages permit arcing to occur over larger air gaps.

Notwithstanding the range of voltages mentioned, the detection techniques described herein are not voltage sensitive. The technique for AC circuits applies for all AC voltages and likewise, the technique for DC circuits applies to all DC voltages.

Figure 2:
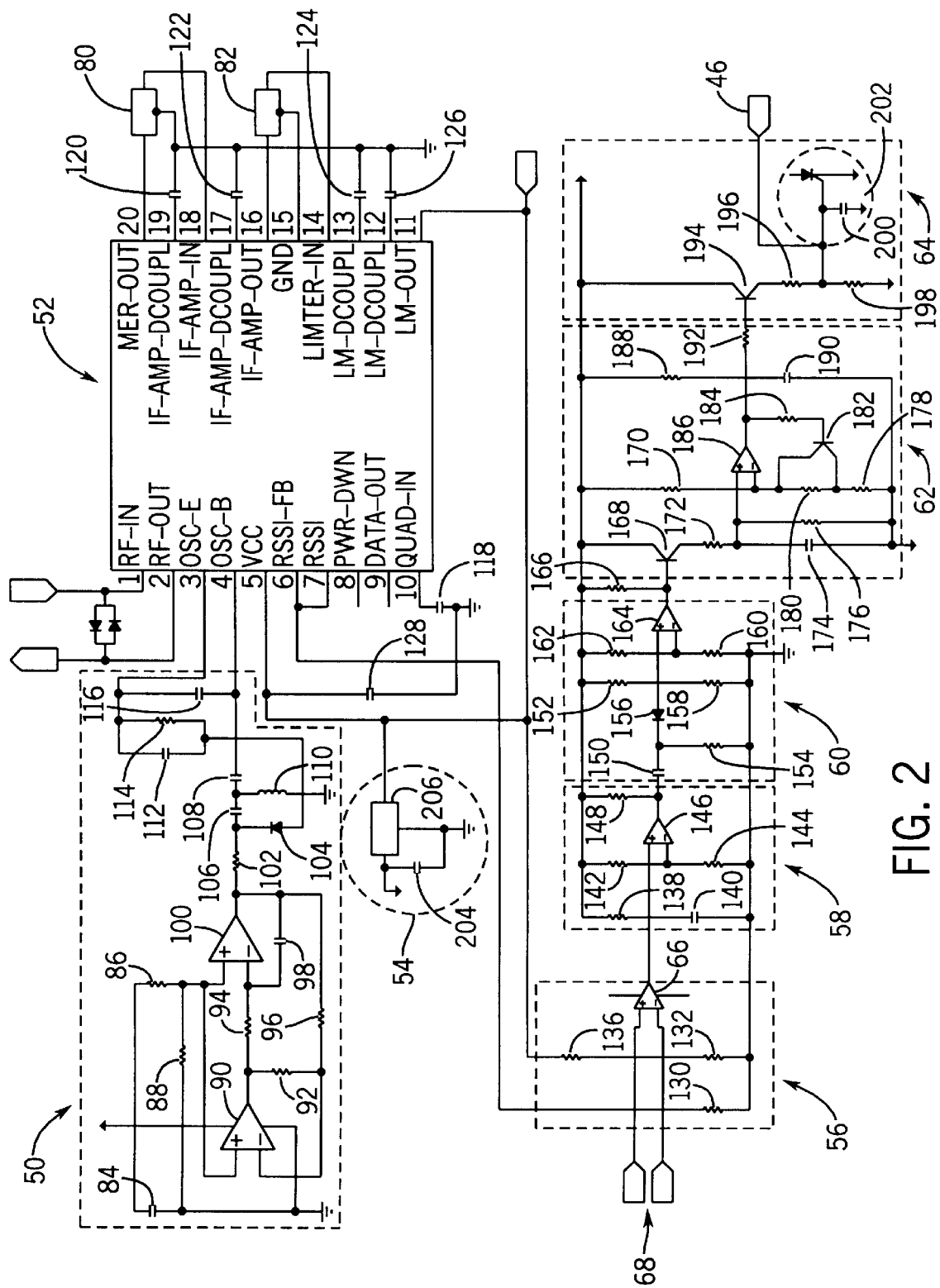
FIG. 2 is a detailed circuit diagram of an exemplary embodiment of an arc detection circuit.

Referring now to FIG. 2, FIG. 2 is a detailed circuit diagram of arc detection circuit 44. In general, arc detection circuit 44 includes an oscillator 50, a heterodyning chip 52 such as chip number SA626 manufactured by Phillips Semiconductor, a power source 54, a level comparator circuit 56, and arc time monitoring circuit 58, one shot circuit 60, a time accumulating circuit 62, and a trip signal generation circuit 64. Oscillator 50 is coupled to the oscillator inputs OSE-E and OSC-B of heterodyning chip 52. In general, oscillator 50 is configured to generate an oscillator frequency which cycles between a low frequency and a high frequency. Ideally, this frequency range would be as broad as possible if it were not cost and component restrained. Some applications may permit costs which would support a range of 20.0 to 40.0 megahertz, and the circuitry shown in FIG. 2 provides an oscillator which generates oscillator frequencies which cycle from 30.0 to 35.0 megahertz wherein the oscillator cycles from the low to the high oscillator frequency in less than one millisecond.

Power supply 54 is a D.C. power supply which supplies three (3) volts to circuit 52 as shown in FIG. 2. This power supply is connected to the D.C. power source 12, but could be configured for connection to A.C. power source 14.

Circuit 52 monitors an electrical circuit (i.e. voltage or current) at the $RF_{in}$ and $RF_{out}$ pins. Depending upon the application these pins are coupled to the positive and/or negative conductors in the circuit. The particular configuration shown in FIG. 2 is for connection to an A.C. system with the conductors of the system being connected at $RF_{in}$ and $RF_{out}$ of chip 52. Chip 52 is also coupled as shown to two 10.7 megahertz filters 80 and 82. These filters were selected based upon the frequencies which are permitted for RF circuit use by the U.S. Government. However, depending upon future availability or uses for the circuit, these filters may be changed to filter at other center frequencies. Chip 52 is wired as shown in FIG. 2 so that chip 52 operates to subtract the frequency of the signal input at $RF_{in}$ and $RF_{out}$ from the frequency of oscillator 50, and filter the difference in these frequencies at 10.7 megahertz. The result is that circuit 52 provides a variable frequency filter.

An analysis of arcing in both A.C. and D.C. circuits shows that arcing generates relatively high amplitude signals across a very large range of frequencies including at least 20.0 through 40.0 megahertz. Accordingly, since oscillator 50 oscillates between 30.0 and 35.0 megahertz, chip 52 will generate a continuously high signal at the RSSI output throughout the oscillation of oscillator 50 when arcing is occurring in the system coupled to the RF input 51 of chip 52. However, when chip 52 merely detects signals which exist at selected frequencies between 30.0 and 35.0 megahertz, chip 52 will only generate spikes or pulses at the RSSI outputs.

Circuit 52 provides logarithymic amplification to the filtered difference between the oscillator 50 signal and the signal applied to $RF_{in}$ and $RF_{out}$. By way of example, this signal generated at RSSI is set to be within a range of 0 to 1 volts wherein that voltage is an indication of the decibel level of the input signal $RF_{in}$.

The signal at RSSI is applied to comparator circuit 56. Circuit 56 includes a comparator 66 and reference voltage terminals 68. In operation, comparator circuit 56 changes output state (e.g. goes high) only if a voltage generated by circuit 52 exceeds the predetermined voltage reference set at terminal 68. The purpose of comparator circuit 56 is to eliminate the effects of background and spurious noise on arc detection. If the signal generated at the RSSI output is greater than the reference signal 68 the output of comparator 66 is set high (i.e. changes state from the normal state representative of no arcing to a state representative of arcing). The signal at the output of comparator 66 is applied to time monitoring circuit 58.

Time monitoring circuit 58 operates to determine if the time the output of comparator 66 is high is indicative of the time period (e.g. milliseconds or more) of a typical arcing event. If the time period is sufficient, then time monitoring circuit 58 applies a signal to one shot circuit 60 which compensates for the extinguishing of an arc when the voltage of the monitored A.C. power goes through the zero crossing. The purpose of the mono-stable multi-vibrator circuit (60) also generally known as a one-shot circuit, is to count the number of arcing half-cycles in an AC wave form.

The signal from one shot circuit 60 is applied to accumulating circuit 62 which determines if there has been arcing for at least a predetermined number of half cycles (e.g. three) of the A.C. system being monitored for arcing. If arcing exists for a predetermined number of half cycles, a signal is applied by circuit 62 to trip circuit 64 which outputs a trip signal on conductor 46 to operate a circuit interrupter such as a circuit breaker or provide a signal to operate an indicator 49.

Figure 4:
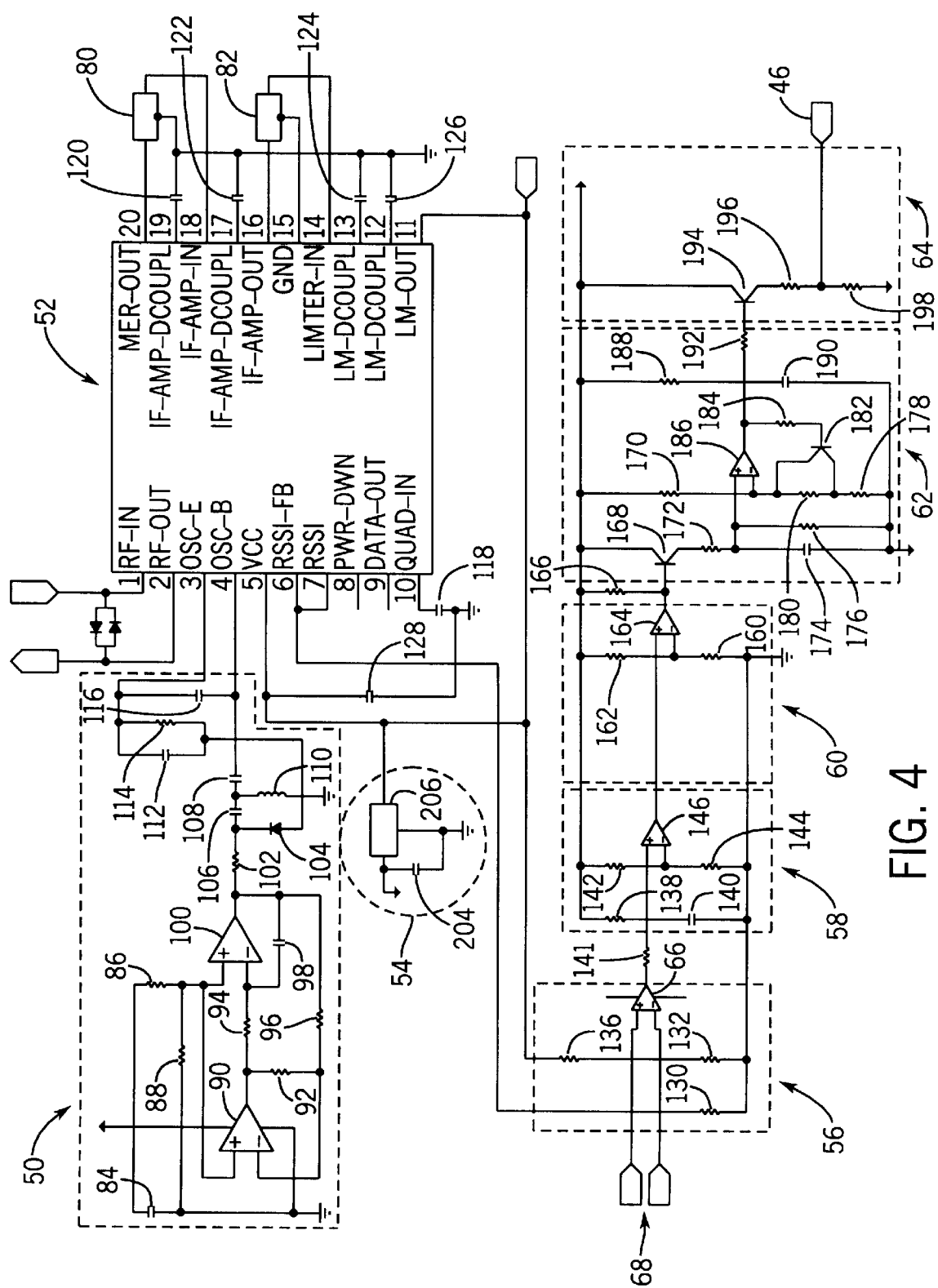
FIG. 4 is a detailed circuit diagram of an exemplary embodiment of a DC arc detection circuit.

The components of the vehicle described in reference to FIG. 1 would normally require D.C. electrical power. The detection circuit of FIG. 2 is configured for an A.C. system and is readily converted into arc detection circuit for a D.C. electrical system. In particular, to convert the circuit of FIG. 2 to an arc detection circuit for a D.C. electrical system, a 1.0 k resistor 141 is inserted at the output of comparator 66, and capacitor 150 and diode 156 of one-shot circuit 60 are removed and replaced by a direct connection between the output of comparator 146 and the negative input of comparator 164. The three associated resistors 152, 154, and 158 of one shot circuit 60 are removed as well as resistor 148. It should be understood that "removed" as used herein may mean simply disconnecting the appropriate lead in the circuit. An exemplary embodiment of a DC circuit is illustrated in FIG. 4. The purpose of this change is to compensate the lack of zero crossings in D.C. circuits. Arcing drop outs compensated for typically have variable durations, for example 0.5 millisecond or 1.0 millisecond.

To monitor the desired electrical circuit either current transformers (CT) or shunts can be used as appropriate to couple the RF inputs of chip 52 to the circuit to be monitored. Depending upon the application and type of loads on electrical circuits either a CT or shunt and the respective configuration thereof would be chosen. For example, for A.C. and D.C. applications it is desirable to eliminate fundamental A.C. or D.C. current signals. Since the frequency range of interest for the circuit shown in FIG. 2 is between 30.0 and 35.0 megahertz, the core of a CT would be a low permeability core. Such low permeability core provides relatively good immunity from noise signals in the kilohertz range and lower.

Figure 3:
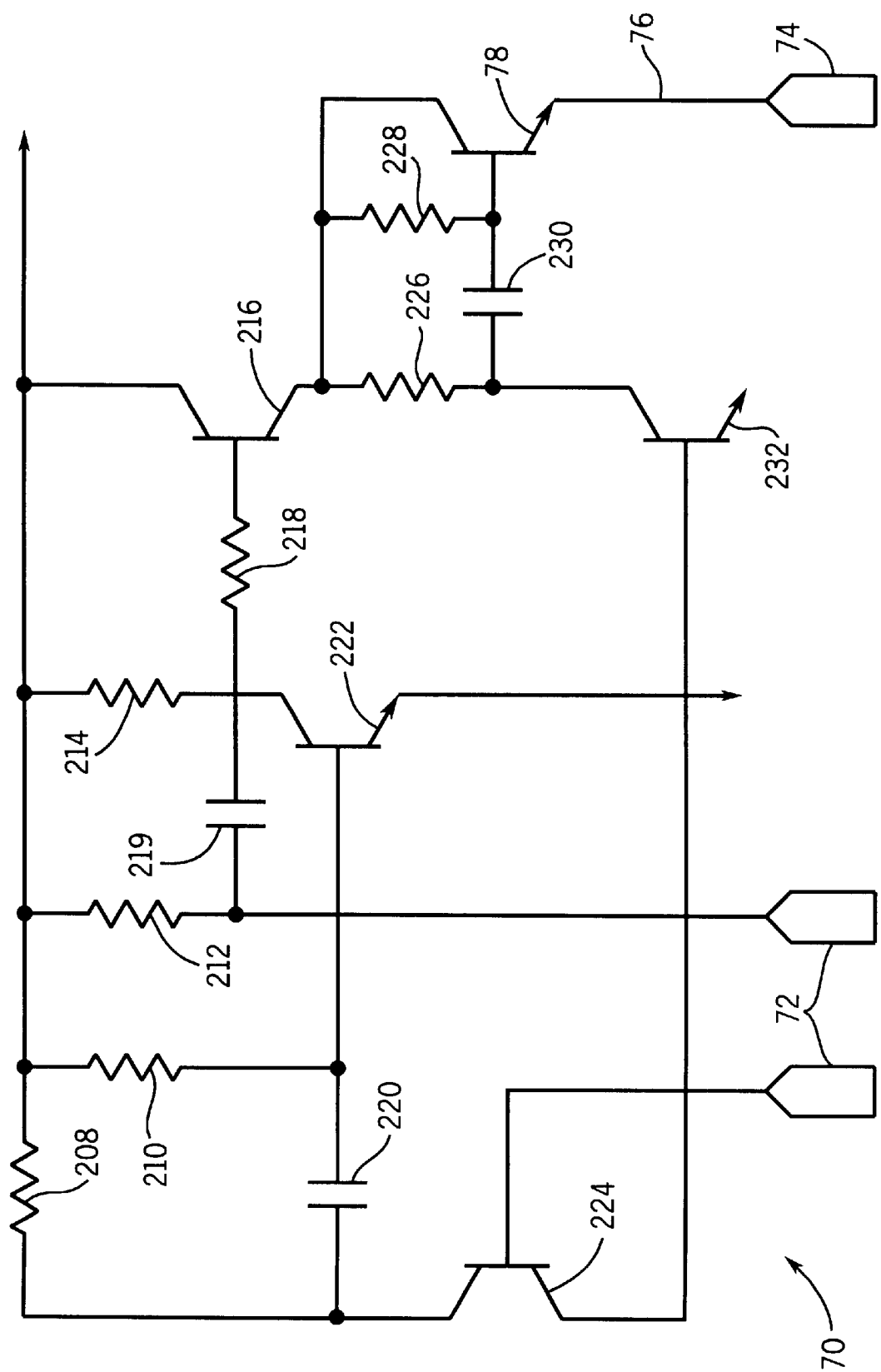
FIG. 3 is a detailed circuit diagram of a simulated arc generation circuit.

Referring to FIG. 3, FIG. 3 illustrates a test circuit 70 including a contact switch having contacts 72 and an output terminal 74 which is coupled to ground wherein the conductor 76 from transistor 78 passes through the system CT. In operation, when contacts 72 are brought into contact, circuit 70 generates a signal which simulates arcing through conductor 76 which is then monitored by the current transformer associated with the A.C. arc detection circuit of FIG. 2 or the D.C. arc detection circuit of FIG. 4 discussed above.

The following is a table listing all of the components set out in FIGS. 2, 3 and 4 and their associated reference numbers, component types and values or part references as applicable.

| Reference No. | Component Type | Component Value or Part Reference |
| --- | --- | --- |
| 52 | Heterodyning Circuit | SA626 |
| 66 | Comparator | LM2901 |
| 78 | Transistor | 2N3904 |
| 80 | 10.7 $MH_z$ Filter | SFECA10.7MAS |
| 82 | 10.7 $MH_z$ Filter | SFECA10.7MAS |
| 84 | Capacitor | 0.1 µF |
| 86 | Resistor | 5.49 k ohms |
| 88 | Resistor | 3.74 k ohms |
| 90 | Comparator | LM 2904 |
| 92 | Resistor | 66.5 k ohms |
| 94 | Resistor | 22.1 k ohms |
| 96 | Resistor | 33.2 k ohms |
| 98 | Capacitor | 0.074 µF |
| 100 | Operational Amplifier | LM2904 |
| 102 | Resistor | 51 k ohms |
| 104 | Diode | MV 7005 |
| 106 | Capacitor | 68 pF |
| 108 | Capacitor | 39 pF |
| 110 | Inductor | 33 nH |
| 112 | Capacitor | 39 pF |
| 114 | Resistor | 22.1 k ohms |
| 116 | Capacitor | 39 pF |
| 118 | Capacitor | 1000 pF |
| 120 | Capacitor | 1000 pF |
| 122 | Capacitor | 1000 pF |
| 124 | Capacitor | 1000 pF |
| 126 | Capacitor | 1000 pF |
| 128 | Capacitor | 0.1 µF |
| 130 | Resistor | 4.99 k ohms |
| 132 | Resistor | 4.02 k ohms |

-continued

| Reference No. | Component Type | Component Value or Part Reference |
| --- | --- | --- |
| 136 | Resistor | 2.3 k ohms |
| 138 | Resistor | 86.6 k ohms |
| 140 | Capacitor | 0.033 µF |
| 141 | Resistor | 1.0 k ohms |
| 142 | Resistor | 11.3 k ohms |
| 144 | Resistor | 33.2 k ohms |
| 146 | Operational Amplifier | LM2901 |
| 148 | Resistor | 20 k ohms |
| 150 | Capacitor | .01 µF |
| 152 | Resistor | 60 k ohms |
| 154 | Resistor | 60 k ohms |
| 156 | Diode | 1N4148 |
| 158 | Resistor | 60 k ohms |
| 160 | Resistor | 5 k ohms |
| 162 | Resistor | 20 k ohms |
| 164 | Operational Amplifier | LM2901 |
| 166 | Resistor | 20 k ohms |
| 168 | Transistor | 2N3904 |
| 170 | Resistor | 42 k ohms |
| 172 | Resistor | 9 k ohms |
| 174 | Capacitor | 0.1 µF |
| 176 | Resistor | 150 k ohms |
| 178 | Resistor | 150 k ohms |
| 180 | Resistor | 20 k ohms |
| 182 | Transistor | 2N3904 |
| 184 | Resistor | 10 k ohms |
| 186 | Operational Amplifier | LM2901 |
| 188 | Resistor | 20 k ohms |
| 190 | Capacitor | 0.01 µF |
| 192 | Resistor | 10 k ohms |
| 194 | Transistor | 2N3904 |
| 196 | Resistor | 8 k ohms |
| 198 | Resistor | 10 k ohms |
| 200 | Capacitor | 0.01 µF |
| 202 | SCR | EC103D |
| 204 | Capacitor | 0.1 µF |
| 206 | Voltage Regulator | LM317 |
| 208 | Resistor | 20 k ohms |
| 210 | Resistor | 150 k ohms |
| 212 | Resistor | 48 k ohms |
| 214 | Resistor | 10 k ohms |
| 216 | Transistor | 2N3904 |
| 218 | Resistor | 1 k ohms |
| 219 | Capacitor | 0.1 µF |
| 220 | Capacitor | 0.01 µF |
| 222 | Transistor | 2N3904 |
| 224 | Transistor | 2N3904 |
| 226 | Resistor | 68 k ohms |
| 228 | Resistor | 510 k ohms |
| 230 | Capacitor | 1.2 nF |
| 232 | Transistor | 2N3904 |

While two embodiments and multiple applications for the arc detection system have been disclosed and described in detail, various other modifications could be considered within the scope of the invention. For example, it is contemplated that the A.C. or D.C. arc detection would be usable in vibrating equipment such as machine tools, robots, and other manufacturing equipment. By way of another example, the center filter frequency of 10.7 megahertz may be modified depending upon frequencies made available by the Government in the future and the particular application for the arc detection. Furthermore, depending upon component availability and cost the frequency range and cycling frequency of oscillator circuit 50 may be modified to suit particular applications, cost constraints and component availability. Still furthermore, it is contemplated that all or a portion of the circuitry disclosed may be embodied on a single chip, and further modifications may include multiple channels of arc detection. These modifications and other applications are intended to be covered in the scope of the appended claims.

What is claimed is:

1. An arc detection circuit for detecting an arcing fault in a DC electrical system having a circuit protection system, the arc detection circuit comprising:

a means for monitoring the DC electrical system;

a means for generating an oscillator frequency which cycles between a low frequency and a high frequency, with the means for generating coupled to the means for monitoring;

a means for eliminating background and spurious noise coupled to the means for monitoring and a reference voltage terminal;

a means for monitoring time of the arcing fault based on a signal from the means for eliminating;

a means for compensating for arcing drop outs based on signal from the means for monitoring time;

a means for generating a further signal indicative of the arc fault if a predetermined time period is exceeded, based on the signal from the means for compensating; and, a means for generating an arc signal to operate the circuit protection system, based on the further signal from the means for generating a further signal.

2. The arc detection circuit of claim 1, including a first means for filtering coupled to the means for monitoring the DC circuit.

3. The arc detection circuit of claim 2, including a second means for filtering coupled to the means for monitoring the DC circuit.

4. The arc detection circuit of claim 3, wherein each filter is configured to operate at a frequency of 10.7 megahertz.

5. The arc detection circuit of claim 4, including a vehicle.

6. The arc detection circuit of claim 5, wherein the vehicle is an automobile.

7. The arc detection circuit of claim 1, wherein the means for monitoring is one of electromagnetically coupled to the DC electrical system and mechanically coupled to the DC electrical system.

8. The arc detection circuit of claim 1, including one of a means for interrupting and a means for indicating, to receive the arc signal from the means for generating an arc signal.

9. A method for detecting an arcing fault in a DC electrical system having a circuit protection system, the method of arc detection comprising the steps of:

monitoring the DC electrical system with a superheterodyne circuit;

generating an oscillator frequency which cycles between a low frequency and a high frequency, with an oscillator circuit coupled to the superheterodyne circuit;

eliminating background and spurious noise with a comparator circuit coupled to the superheterodyne circuit and a reference voltage terminal;

monitoring time of the arcing fault based on a signal from the comparator circuit with an arc timing monitor circuit;

compensating for arcing drop outs based on signal from the arc timing monitor circuit with a compensating circuit;

generating a further signal indicative of the arc fault if a predetermined time period is exceeded, with an accumulating circuit based on the signal from the compensating circuit; and, generating an arc signal to operate the circuit protection system, with a trip signal generation circuit based on the further signal from the accumulating circuit.

10. The method of arc detection of claim 9, including the step of coupling a first filter to the superheterodyne circuit.

11. The method of arc detection of claim 10, including the step of coupling a second filter to the superheterodyne circuit.

12. The method of arc detection of claim 11, wherein each filter is configured to operate at a frequency of 10.7 megahertz.

13. The method of arc detection of claim 12, including the step of installing the arc detection circuit in a vehicle.

14. The method of arc detection of claim 13, wherein the vehicle is an automobile.

15. The method of arc detection of claim 9, including the step of activating one of a circuit interrupter and an indicator.

16. An arc detection circuit for detecting an arcing fault in a DC electrical system having a circuit protection system, the arc detection circuit comprising:

superheterodyne circuit configured to monitor the DC electrical system;

an oscillator circuit configured to generate an oscillator frequency which cycles between a low frequency and a high frequency, with the oscillator circuit coupled to the superheterodyne circuit;

a comparator circuit configured to eliminate background and spurious noise, the comparator circuit coupled to the superheterodyne circuit and a reference voltage terminal;

an arc timing monitor circuit configured to monitor time of the arcing fault based on signal from the comparator circuit;

a compensating circuit configured to compensate for arcing drop outs when signal from the arc timing monitor circuit is received by the compensating circuit;

an accumulating circuit configured to receive the signal from the compensating circuit and generate a further signal indicative of the arc fault if a predetermined time period is exceeded; and, a trip signal generation circuit configured to receive the further signal from the accumulating circuit and generate an arc signal to operate the circuit protection system.

17. The arc detection circuit of claim 16, including a first filter coupled to the superheterodyne circuit.

18. The arc detection circuit of claim 17, including a second filter coupled to the superheterodyne circuit.

19. The arc detection circuit of claim 18, wherein each filter is configured to operate at a frequency of 10.7 megahertz.

20. The arc detection circuit of claim 16, wherein the arc signal activates one of a circuit interrupter and an indicator.

* * * * *